(12) United States Patent
Raychowdhury et al.

(10) Patent No.: US 9,577,641 B2
(45) Date of Patent: *Feb. 21, 2017

(54) SPIN TRANSFER TORQUE BASED MEMORY ELEMENTS FOR PROGRAMMABLE DEVICE ARRAYS

(71) Applicant: Intel Corporation, Santa Clara, CA (US)

(72) Inventors: Arijit Raychowdhury, Hillsboro, OR (US); James W. Tschanz, Portland, OR (US); Vivek De, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/016,260

(22) Filed: Feb. 4, 2016

(65) Prior Publication Data
US 2016/0156355 A1 Jun. 2, 2016

Related U.S. Application Data

(63) Continuation of application No. 13/997,962, filed as application No. PCT/US2012/031371 on Mar. 30, 2012, now Pat. No. 9,270,278.

(51) Int. Cl.
*H03K 19/177* (2006.01)
*G11C 11/16* (2006.01)

(52) U.S. Cl.
CPC ......... *H03K 19/17728* (2013.01); *G11C 11/16* (2013.01); *H03K 19/177* (2013.01)

(58) Field of Classification Search
CPC .............................. G11C 11/16; G11C 13/0069
(Continued)

(56) References Cited

U.S. PATENT DOCUMENTS

| 6,014,509 A | 1/2000 | Furtek et al. |
| 7,378,871 B2 | 5/2008 | Okamoto |

(Continued)

FOREIGN PATENT DOCUMENTS

| KR | 10-1999-0029032 | 4/1999 |
| KR | 10-1999-0029032 | 3/2012 |

(Continued)

OTHER PUBLICATIONS

International Search Report for corresponding International Patent Application No. PCT/US2012/031371 issued Nov. 28, 2012, total of 3 sheets.

(Continued)

*Primary Examiner* — Jason M Crawford
(74) *Attorney, Agent, or Firm* — Pillsbury Winthrop Shaw Pittman LLP

(57) ABSTRACT

Disclosed herein are semiconductor device arrays, such as, Field Programmable Gate Arrays (FPGAs) and Complex Programmable Logic Arrays (CPLAs) that use high-density Spin Transfer Torque (STT)-based memory elements. STT-based memory elements can either be stand-alone FPGAs/CPLAs, or can be embedded in microprocessors and/or digital signal processing (DSP) system-on-chip (SoC) to provide design flexibility for implementing low power, scalable, secure and reconfigurable hardware architecture. Because the configuration is stored on the FPGA/CPLA die itself, the need for loading the configuration from external storage every time is eliminated when the device is powered on. In addition to instant startup, eliminating configuration I/O traffic results in power savings and possible pin count reduction. Security is greatly improved by eliminating the need to store configuration data in an external memory.

17 Claims, 8 Drawing Sheets

(58) Field of Classification Search
USPC .............. 326/37–41, 47; 365/148, 158
See application file for complete search history.

(56) References Cited

U.S. PATENT DOCUMENTS

| | | | |
|---|---|---|---|
| 7,898,859 | B2 | 3/2011 | Ghodsi |
| 7,965,101 | B2 | 6/2011 | Price et al. |
| 8,754,491 | B2 | 6/2014 | Abraham et al. |
| 9,270,278 | B2* | 2/2016 | Raychowdhury ....... G11C 11/16 |
| 2006/0119387 | A1 | 6/2006 | Okamoto |
| 2008/0238475 | A1 | 10/2008 | Chua-Eoan et al. |
| 2009/0034320 | A1 | 2/2009 | Ueda |
| 2010/0039136 | A1 | 2/2010 | Chua-Eoan et al. |
| 2010/0213975 | A1 | 8/2010 | Price et al. |
| 2011/0069536 | A1 | 3/2011 | Lou et al. |
| 2011/0216573 | A1 | 9/2011 | Abe et al. |
| 2011/0273926 | A1 | 11/2011 | Wu et al. |
| 2012/0314477 | A1 | 12/2012 | Siau |
| 2014/0043062 | A1* | 2/2014 | Guillemenet ........... G11C 11/15 326/41 |

FOREIGN PATENT DOCUMENTS

| | | |
|---|---|---|
| WO | 98-08306 | 2/1998 |
| WO | 1998-08306 | 2/1998 |

OTHER PUBLICATIONS

Korean Notice of Preliminary Rejection for corresponding Korean Patent Application No. 10-2014-7027034 issued Feb. 12, 2016.

Paul, Somnath et al., "Hybrid CMOS-STTRAM Non-Volatile FPGA: Design Challenges and Optimization Approaches", IEEE/ACM International Conference on Computer-Aided Design, 2008, pp. 589-592.

Salahuddin, Sayeef et al., "Quantum Transport Simulation of Tunneling Based Spin Torque Transfer (STT) Devices: Design Trade offs and Torque Efficiency", IEEE International Conference on Electron Devices Meeting, Jan. 2008, pp. 121-124.

Sankey, Jack C. et al., "Measurement of the Spin-Transfer-Torque Vector in Magnetic Tunnel Junctions", Nature Physics, vol. 4, Jan. 2008, 33 pages.

* cited by examiner

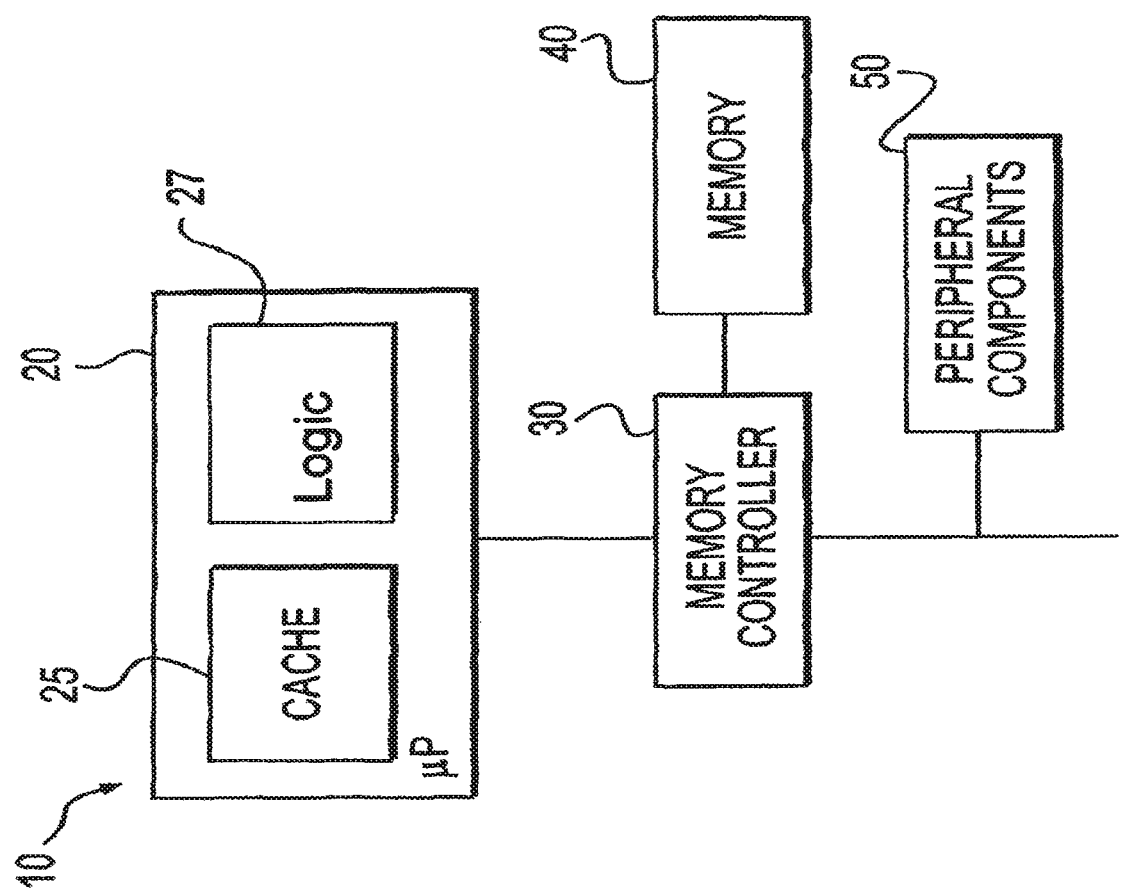

SPIN TRANSFER TORQUE BASED MEMORY ELEMENTS FOR PROGRAMMABLE DEVICE ARRAYS

CROSS-REFERENCE TO RELATED APPLICATIONS

This present application is a continuation of U.S. patent application Ser. No. 13/997,962, filed on Oct. 22, 2013, which claims priority to International Application No. PCT/US2012/031371, filed on Mar. 30, 2012, the entire contents of both of these applications are incorporated herein by reference.

TECHNICAL FIELD

This disclosure relates generally to the field of integrated circuits used in high-volume computer architecture and reconfigurable systems, including systems-on-chip (SoC), and in particular, to non-volatile memory devices and systems using spin transfer torque (STT) effects.

BACKGROUND ART

Programmable device arrays are basic building blocks for configurable logic circuits used in computer systems. Examples of programmable device arrays include Field Programmable Gate Arrays (FPGA), Complex Programmable Logic Arrays (CPLA), etc.

Current FPGAs use either Static Random Access Memory (SRAM) cells or antifuses to program the logic cells and crossbar switches (i.e., a matrix switch connecting multiple inputs to multiple outputs). Antifuse based FPGAs are one-time programmable only, and hence they have limited use. SRAM-based FPGAs also suffer from a couple of known problems. For example, the logic cells typically have high leakage power. Also, though SRAM uses bi-stable latching circuitry to store each bit, it is still a volatile type of memory in the sense that data is eventually lost if the memory device is not externally powered. Therefore, the entire SRAM needs to be reloaded with configuration data whenever the FPGA is powered on. This necessitates an external non-volatile storage (e.g., Flash storage), and dedicated Input/Outputs (I/Os) for configuration, and leads to relatively long programming time on startup. An additional disadvantage is that there may be security issues associated with storing configuration data in off-die memory arrays, requiring additional complex encryption schemes.

Non-volatile types of RAMs have characteristics that are favorable for embedding in high-speed high-density logic circuitry. Spin Transfer Torque Random Access Memory (STTRAM) is a type of non-volatile RAMs that is typically used for more conventional memory circuits, such as, cache, secondary storage etc. Current high-speed high-density logic circuits like FPGAs/CPLAs typically do not employ STTRAM or other STT-based elements. Some researchers have proposed to hybridize conventional Complementary Metal Oxide Semiconductor (CMOS)-based FPGA design with STTRAM to implement a CMOS-STTRAM non-volatile FPGA configuration. See, for example, the article entitled, "Hybrid CMOS-STTRAM Non-Volatile FPGA: Design Challenges and Optimization Approaches," by Paul et al., pp. 589-592, 2008 IEEE/ACM International Conference on Computer-Aided Design. However, there is room to bring STTRAM closer to logic level and embedding non-volatile memory bits in reconfigurable logic to be used in high-volume computer architectures and interfaces. The present disclosure addresses the shortcomings of the currently available solutions by proposing devices using STT-based elements and associated manufacturing process thereof.

BRIEF DESCRIPTION OF THE DRAWINGS

Embodiments of the present disclosure are illustrated by way of example, and not by way of limitation, in the figures of the accompanying drawings in which like reference numerals refer to similar elements.

FIG. 1A depicts a high-level block diagram illustrating selected aspects of a system, in accordance with an embodiment of the present disclosure.

DETAILED DESCRIPTION

Figure 1B:
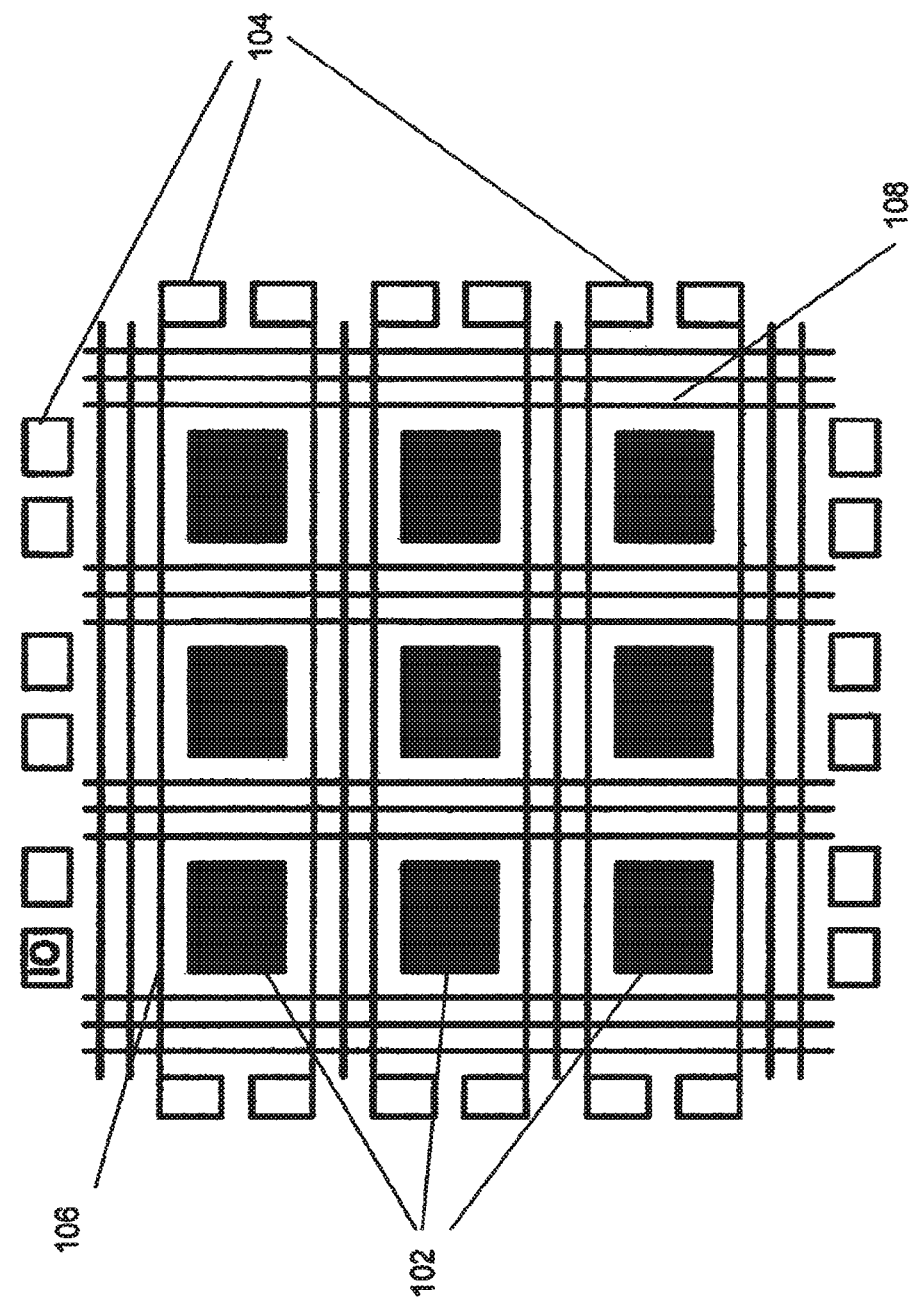
FIG. 1B depicts a basic architecture of a CPLA or FPGA, including logic cells and interconnects, in accordance with an embodiment of the present disclosure.

In the description that follows, like components have been given the same reference numerals, regardless of whether they are shown in different embodiments. To illustrate an embodiment(s) of the present disclosure in a clear and concise manner, the drawings may not necessarily be to scale and certain features may be shown in somewhat schematic form. Features that are described and/or illustrated with respect to one embodiment may be used in the same way or in a similar way in one or more other embodiments and/or in combination with or instead of the features of the other embodiments.

In accordance with various embodiments of this disclosure, what is proposed is semiconductor device arrays, such as, FPGAs and CPLAs, that use high-density Spin Transfer Torque (STT)-based memory elements.

STT is an effect in which the orientation of a magnetic layer in a magnetic tunnel junction (MTJ) device can be modified using a spin-polarized current. In STT-based MJTs, device resistance can be either low or high, depending on the relative angular difference between the directions of magnetic polarization on both sides of the tunnel junction.

STT-based memory elements can be used either in stand-alone FPGAs/CPLAs, or can be embedded in microprocessors and/or digital signal processors (DSPs) to provide design flexibility for implementing low power, scalable and reconfigurable hardware architecture. As will be appreciated by the persons skilled in the art, microprocessors and system-on-chips (SoCs) are increasingly embedding reconfigurable structures for enhanced customization and configurability. Embodiments of this disclosure make embedded FPGA/CPLA self-contained, secure, higher performance, and lower power.

Additionally, it is noted that although systems and processes have been described primarily with reference to FPGAs/CPLAs in the illustrative examples, it will be appreciated that in view of the disclosure herein, certain aspects, architectures, and principles of the disclosure are equally applicable to other types of device memory and logic arrays.

Turning to the figures, FIG. 1A is a high-level block diagram illustrating selected aspects of a system implemented, according to an embodiment of the present disclosure. System 10 may represent any of a number of electronic and/or computing devices, that may include a memory device. Such electronic and/or computing devices may include servers, desktops, laptops, mobile devices, smartphones, gaming devices, tablet computers, networking devices, etc. In alternative embodiments, system 10 may include more elements, fewer elements, and/or different elements. Moreover, although system 10 may be depicted as comprising separate elements, it will be appreciated that such elements may be integrated on to one platform, such as SoCs. In the illustrative example, system 10 comprises a microprocessor 20, a memory controller 30, a memory 40 and peripheral components 50. The microprocessor 20 includes a cache 25 that may be part of a memory hierarchy to store instructions and data, and the system memory 40 may also be part of the memory hierarchy. Cache 25 may comprise SRAM devices. Communication between the microprocessor 20 and the memory 40 may be facilitated by the memory controller (or chipset) 30, which may also facilitate in communicating with the peripheral components 50. The microprocessor 20 may also include one or more logic module 27. Logic module 27 may comprise FPGA/CPLA.

The SRAM device includes an array (M rows and N columns) of memory cells. The SRAM device may also include a row decoder, a timer device and I/O devices (or I/O outputs). Bits of the same memory word may be separated from each other for efficient I/O design. A multiplexer (MUX) may be used to connect each column to the required circuitry during a READ operation. Another MUX may be used to connect each column to a write driver during a WRITE operation.

FIG. 1B illustrates the basic architecture of FPGAs and CPLAs. As discussed above, FPGAs and CPLAs provide reconfigurability with low programming overhead. The basic structure of an FPGA includes an array of individual logic cells 102 with routing channels (106 and 108) laid out in a grid-like manner between peripheral I/O pads 104, thereby providing reconfigurable connection from one cell to another. Note that, CPLA is sometimes referred to as CPLD (Complex Programmable Logic Device) in the pertinent art.

In conventional FPGA/CPLA, configuration data of the routing and the operation of the logic cells are stored in local memory. This is mostly based on conventional volatile SRAM. Additional non-volatile storage (mostly Flash) on package or board is needed to store a copy of the reconfiguration data. When the FPGA/CPLD powers up, the local SRAM storage is loaded with the configuration data. This conventional scheme suffers from various problems, such as: (a) high leakage power from SRAM bit cells; (c) long boot-up time during which the configuration settings are loaded in the SRAM arrays, and (d) possible security issues with storing proprietary configuration data in off-die external memory. In order to circumvent these problems, the present inventors propose the use of STTRAM to store the configuration bits locally. STTRAM elements store two binary states as two different values of resistance, and maintain the stored data even when power is removed.

Figure 2B:
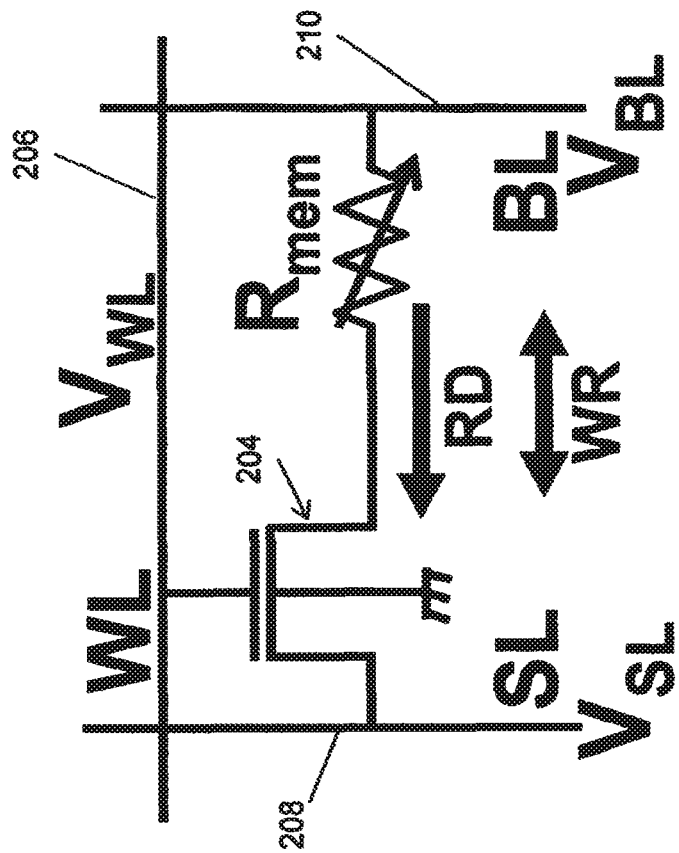
FIG. 2A-2B depict the schematic of a typical one-transistor-one-resistor (1T1R) device showing the bit-line (BL), word-line (WL) and source line (SL).
Figure 2A:
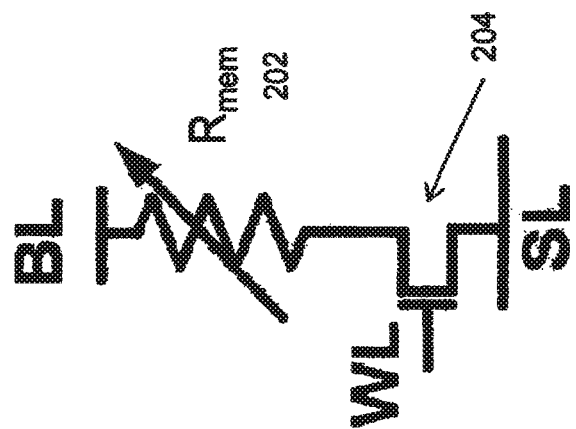

STTRAM uses a special write mechanism based on spin polarization current induced magnetization switching that greatly enhances its scalability by reducing power consumed for writing. FIGS. 2A-2B show schematics of the basic elements of a STTRAM cell, comprising a transistor 204 and a variable resistive element $R_{mem}$ (element 202). The combined structure is referred to 1T1R (one transistor one resistor) cell. Bit-line (BL, element 210), word line (WL, element 206), and source-line (SL, element 208) for the cell are shown more prominently in FIG. 2B, with corresponding voltages, $V_{BL}$, $V_{WL}$, and $V_{SL}$ respectively. The transistor 204 acts as a selector switch, while the resistive element 202 is a magnetic tunnel junction (MTJ) device, comprising two ferromagnetic layers, one with a fixed 'reference' magnetization direction, and the other with a variable magnetization direction, separated by a junction layer. FIG. 2B shows while there is only one read direction (the arrow labeled RD), the write operation can be bi-directional (the double-headed arrow labeled WR). Therefore, this 1T1R structure can be described as a 1T-1STT MTJ memory cell with unipolar 'read' and bipolar 'write.'

Figure 3:
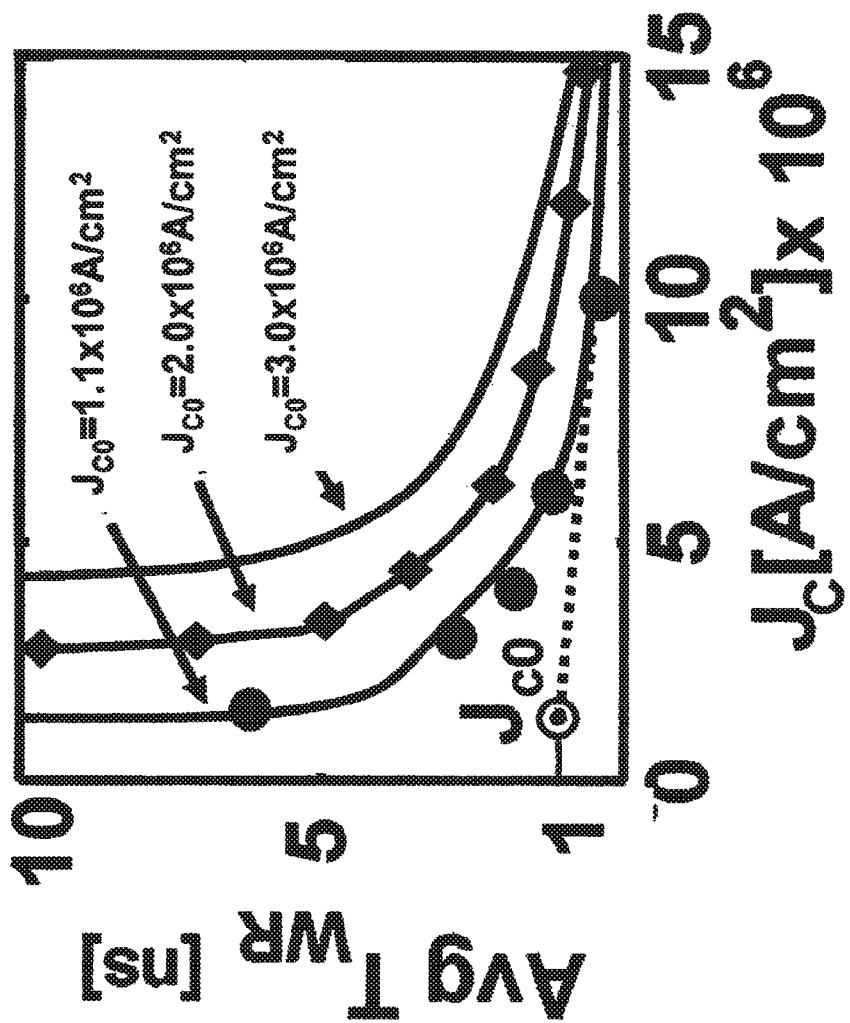
FIG. 3 depicts simulation results showing performance improvement of STTRAM-based devices, in accordance with various aspects of the present disclosure.

FIG. 3 shows a simulation result 300, where it is shown how average write time 'Avg $T_{WR}$' goes down with increased current density. FIG. 3 illustrates a wide operating range for the STTRAM bit-cell. With increasing current density $J_C$, the switching time of the bit cell decreases, thereby enabling different operating currents and times, as demanded by the system level specifications.

Figure 4B:
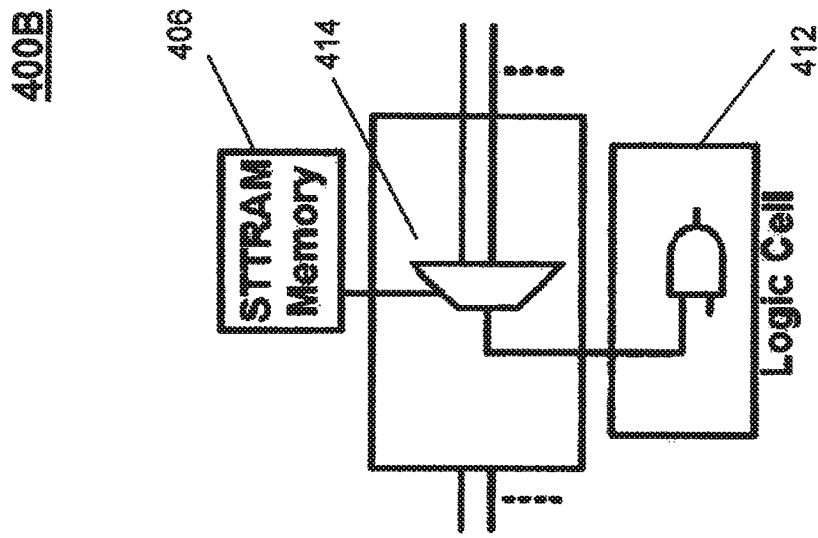
FIGS. 4A-4B depict two different embodiments of STTRAM-based logic circuits, according to aspects of the present disclosure.
Figure 4A:
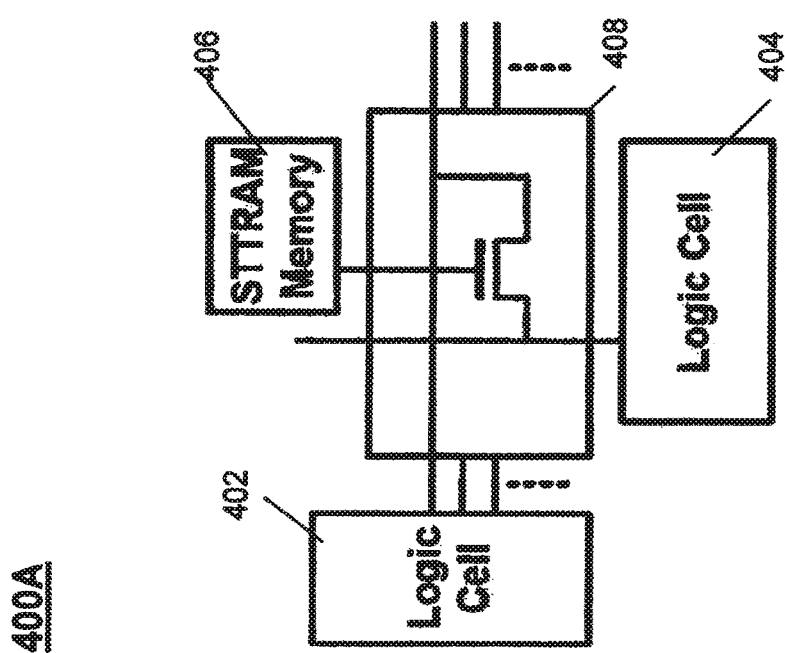

The FPGA/CPLD architecture can be accomplished by arraying the basic 1T1R cells (described with reference to FIGS. 2A-2B) in various ways. Two illustrative example embodiments are shown in FIGS. 4A and 4B. In both the embodiments 400A and 400B, configuration data (or a routing table) is stored locally in STTRAM. Both these embodiments allow low power, non-volatile implementation of the routing table. The entire configuration data can be stored locally inside each switchbox, or, in a central array of STTRAM bitcells (shown as the element 406). In the embodiment 400A, each switchbox comprises local embedded STTRAM which stores routing configuration and routes data between various logic blocks (e.g., 402 and 404). Many such elements can be put together in an array to realize a large reconfigurable logic circuit. In the embodiment 400B, the routing table of the entire circuit is stored in a centralized STTRAM array and the necessary configuration data is routed to local switchboxes. In the switchbox, this is used as Multiplexer (MUX)-select signal to route data from one logic block to another. In both cases, every time the FPGA/CPLD powers on, the appropriate configuration is already in place. This leads to faster boot-up.

In the embodiment 400A, the configuration data for routing between logic elements 402 and 404 can either open or close a switch connection at switchbox (or router) 408. In the alternative embodiment 400B, the STTRAM storage 406 can store MUX-select data for the router, and the logic cells 412 are driven by the correct signals. Element 414 is the MUX.

Figure 5:
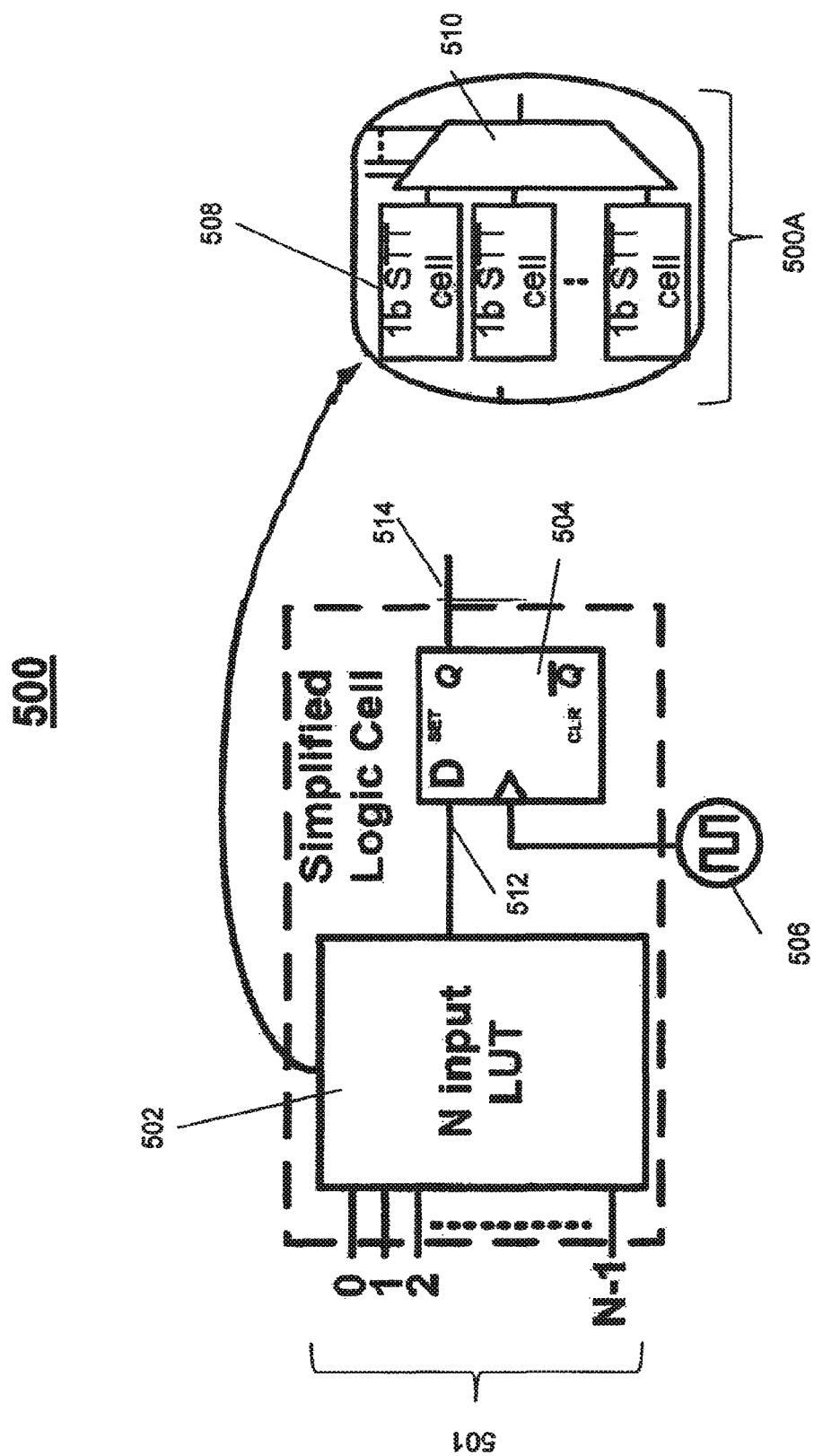
FIG. 5 depicts a version of FPGA employing a Look-Up Table (LUT), in accordance with various aspects of the present disclosure.

Certain versions of FPGAs employ Look Up Tables (LUTs) to store configuration data. As discussed before, conventional SRAM-based FPGAs with LUTs also suffer from the known problems of high leakage, the requirement for nonvolatile external storage on package, high boot-up time etc. The current inventors propose the use of STTRAM based LUTs in logic cells providing low power, nonvolatile storage of configuration data. This employs an STTRAM array of 1T1R cells that stores configuration data. Whenever a connection needs to be established between two or more logic blocks, the STTRAM array is read and depending on the read value, a connection in the LUT is established. FIG. 5 shows a logic cell 500 including a LUT structure 502 with N number of inputs 501. LUT 502 is implemented with 1-bit STTRAM elements 508. As shown in the exploded view in the inset 500A, the 1b-STTRAM elements 508 in the N-input LUT 502 are connected to a MUX 510. The flip flop element, 504 receives a clock signal 506 and the MUX output signal 512 to process the output signal 514 of the logic cell 500.

Figure 6:
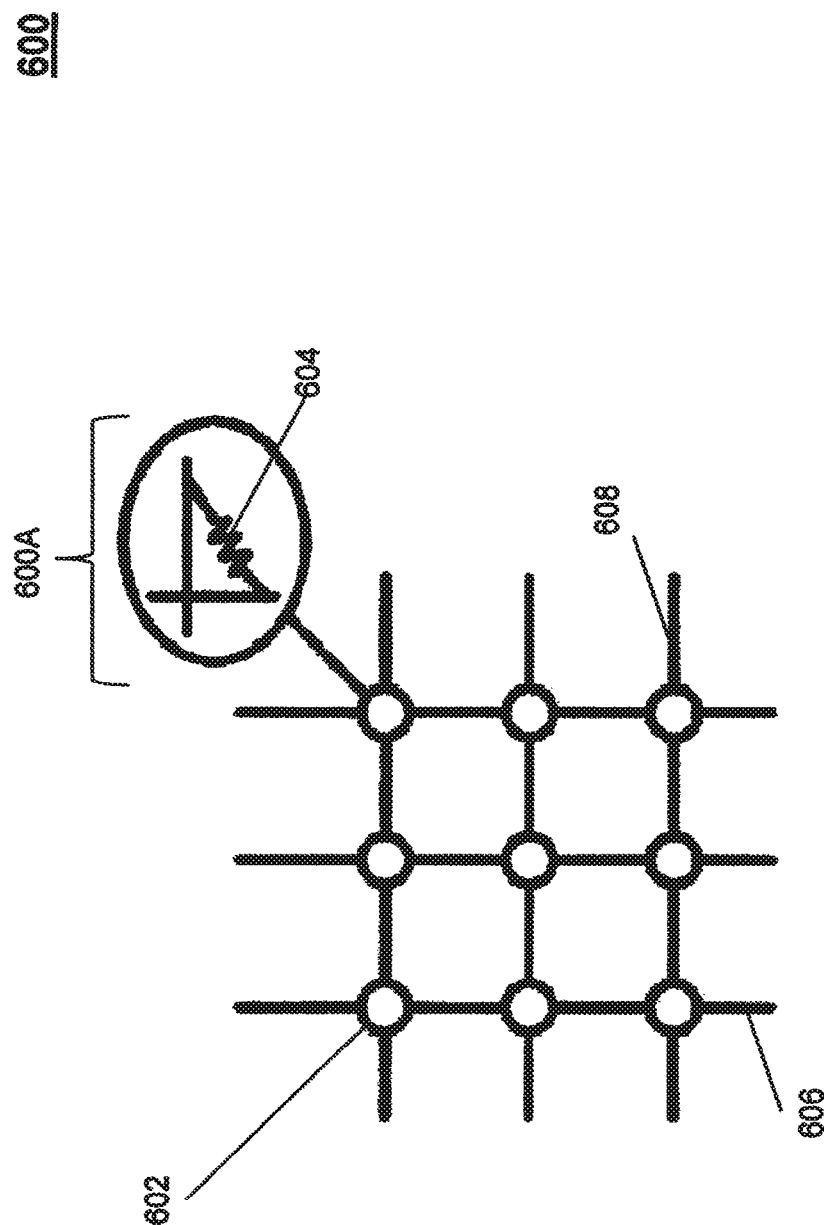
FIG. 6 depicts a switchbox topology showing an STTRAM element in a crossbar configuration, in accordance with an aspect of the present disclosure.

As discussed before, STTRAM elements show two states with two different resistance values—low and high, depending on the magnetic polarizations being parallel (P) or anti-parallel (AP). If the difference in resistances between the two states of an STTRAM element is large enough, then the selector switch may be eliminated, opening up the possibility of higher density device packing. In this case, it is possible to store routing configuration locally using a crossbar structure, rather than in a separate memory block, as shown in FIG. This selector-less configuration 600, known as a switchbox configuration, can be seen in FIG. 6. Vertical and horizontal channels 606 and 608 are reconfigured using the selector-less STTRAM cells 602. As shown in the inset 600A, the only element in the cell is resistor 604, where the transistor used as a selector switch in the schematic shown in FIGS. 2A-2B is eliminated. This would lead to higher integration densities still providing non-volatility and low power.

Figure 7:
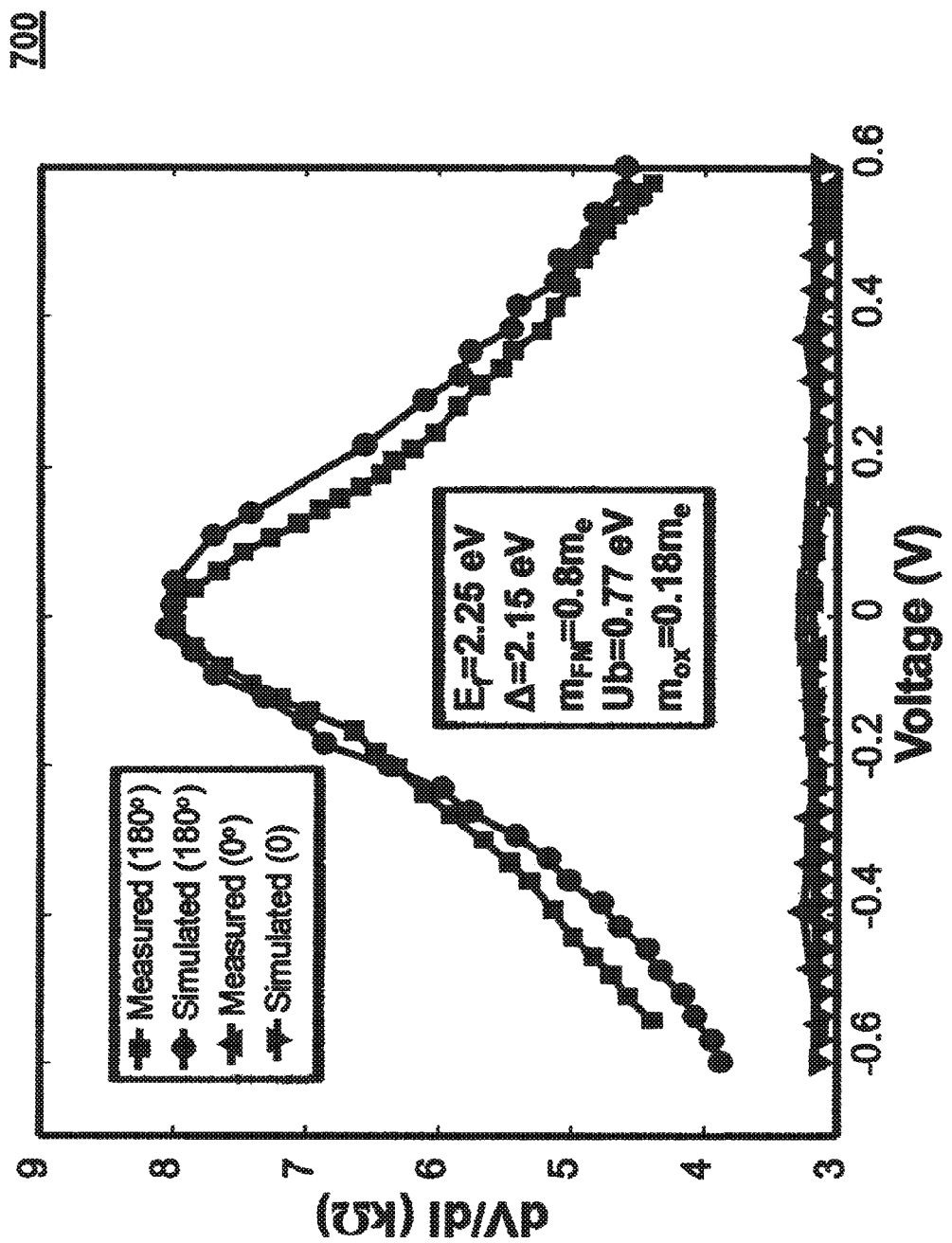
FIG. 7 depicts additional simulation results showing variation of resistance of an STTRAM device with applied voltage, in accordance with an aspect of the present disclosure.

FIG. 7 shows simulation results from a numerical solver that predicts variation of device resistance with varying voltage. From the plot the two different states of the resistance (i.e., AP (180°) and P(0°) conditions) can be easily noted. The simulation methodology involves self-consistently solving the Landau-Lifshitz-Gilbert (LLG) equation for the magnetic dynamics with the Non-Equilibrium Green's Function (NEGF) based transport. For reference, see the article titled, "Quantum Transport Simulation of Tunneling Based Spin Torque Transfer (STT) Devices: Design Tradeoffs and Torque Efficiency," by S. Salahuddin et al., IEDM Technical Digest, pp. 121-124, December 2007. In one particular instance of the simulation for various calibrated physical parameters, like, Fermi Level Energy ($E_F$), band-splitting of the ferromagnet ($\square$), electron mass in the ferromagnet and the oxide ($m_{FM}$ and $m_{OX}$), and Ub (oxide barrier height), shown in FIG. 7, a resistance change of more than 2× is noted. Simulation results have good match with experimental data obtained from an article titled, "Measurements of the Spin-Transfer-Torque Vector in Magnetic Tunnel Junctions," by Sankey et al., Nat. Phys., vol. 4, no. 1, pp. 67-71, January 2008, for AP (180°) and P(0°) conditions.

Therefore, in summary, embodiments of the present disclosure solve several issues that plague the existing SRAM-based FPGAs/CPLAs, and, enable low power and high density FPGAs/CPLAs based on STTRAM. Providing on-die STTRAM nonvolatile storage enables at least some of the following benefits over existing architectures:

The need for external flash memory (either on package or on board) is eliminated, providing cost reduction and saving real estate on the board.

Instant startup is enabled. Because the configuration is stored on the FPGA/CPLA die itself, there is no need to load the configuration from external storage every time the device is powered on. In addition to instant startup, eliminating configuration I/O traffic results in power savings and possible pin count reduction.

Security is greatly improved by eliminating the need to store configuration data in an external memory. Because the configuration data never leaves the die, it is impossible to observe or modify the configuration data through external means.

Having thus described the novel concepts and principles of the STTRAM based memory and logic circuits, it will be apparent to those skilled in the art after reading this detailed disclosure that the foregoing detailed disclosure is intended to be presented by way of example only and is not limiting. Various alterations, improvements, and modifications will occur and are intended to those skilled in the art, though not expressly stated herein. The alterations, improvements, and modifications are intended to be suggested by this disclosure, and are within the spirit and scope of the exemplary aspects of this disclosure. Additionally, the recited order of processing elements or sequences, or the use of numbers, letters, or other designations therefore, is not intended to limit the claimed processes and methods to any order except as can be specified in the claims. Although the above disclosure discusses through various examples what is currently considered to be a variety of useful aspects of the disclosure, it is to be understood that such detail is solely for that purpose, and that the appended claims are not limited to the disclosed aspects, but, on the contrary, are intended to cover modifications and equivalent arrangements that are within the spirit and scope of the disclosed aspects.

What is claimed is:

1. A system, comprising:
   a programmable device array, the programmable device array including:
   a non-volatile memory portion for storing configuration data in a plurality of memory elements that use a spin transfer torque (STT) effect, wherein the non-volatile memory portion comprises a central array of STT random access memory (STTRAM) elements; and
   a plurality of logic cells, wherein the central array of STTRAM elements provides centralized storage of the configuration data for the plurality of logic cells.

2. The system of claim 1, wherein the programmable device array comprises one of a Field Programmable Gate Array (FPGA) and a Complex Programmable Logic Array (CPLA).

3. The system of claim 1, wherein the programmable device array further includes a circuit that controls routing of relevant configuration data between the STTRAM elements and the plurality of logic cells, wherein the circuit comprises a Look Up Table (LUT).

4. The system of claim 3, wherein the LUT comprises:
   N number of inputs for receiving configuration data from an array of N number of 1-bit STTRAM memory elements; and
   a multiplexer (MUX) circuit that establishes connection between desired ports within the LUT by reading the received configuration data, and outputs desired data to the corresponding logic cell.

5. The system of claim 1, wherein a difference between two resistance values of individual STTRAM elements is sufficiently large, thereby eliminating need of a selector switch integrated with the STTRAM element.

6. The system of claim 1, wherein individual STTRAM elements are coupled in a switchbox configuration employing routing channels in a crossbar structure.

7. The system of claim 1, wherein the programmable device array is one of the following: a standalone STTRAM array that can be coupled with a logic circuit; and an embedded STTRAM array integrated with a logic circuit.

8. A method of implementing a programmable device array in an electronic system, the method comprising:
    storing configuration data in a plurality of memory elements included in a non-volatile memory portion, the memory elements using a spin transfer torque (STT) effect, wherein the non-volatile memory portion comprises a central array of STT random access memory (STTRAM) elements, the central array of STTRAM elements providing centralized storage of the configuration data for a plurality of logic cells.

9. The method of claim 8, wherein the programmable device array comprises one of a Field Programmable Gate Array (FPGA) and a Complex Programmable Logic Array (CPLA).

10. The method of claim 8, further comprising controlling routing of relevant stored configuration data between the STTRAM elements and the plurality of logic cells, wherein the controlling comprises providing a Look Up Table (LUT).

11. The method of claim 10, wherein providing the LUT comprises:
    receiving configuration data from an array of N number of 1-bit STTRAM memory elements; and
    establishing connection between desired ports within the LUT by reading the received configuration data, and outputting desired data to the corresponding logic cell.

12. The method of claim 8, further comprising:
    making a difference between two resistance values of individual STTRAM elements sufficiently large, thereby eliminating need of a selector switch integrated with the STTRAM element.

13. The method of claim 8, further comprising arranging individual STTRAM elements in a switchbox configuration.

14. The method of claim 8, wherein the programmable device array is one of the following: a standalone STTRAM array that can be coupled with a logic circuit; and an embedded STTRAM array integrated with a logic circuit.

15. A method of implementing a programmable device array with embedded spin transfer torque random access memory (STTRAM) in a system-on-chip (SoC), the method comprising:
    locally storing configuration data in a plurality of STTRAM elements which are in physical proximity with corresponding one or more logic cells; and
    arranging routing channels in a crossbar structure, coupling each logic cell with corresponding STTRAM elements storing the configuration data,
    wherein at least one of the STTRAM elements is associated with two resistance values, wherein presence of a selector switch in the at least one of the STTRAM elements depends on a difference of the two resistance values.

16. The method of claim 15, wherein the programmable device array comprises one of a Field Programmable Gate Array (FPGA) and a Complex Programmable Logic Array (CPLA).

17. The method of claim 15, wherein the at least one of the STTRAM elements only includes a resistor.

* * * * *